United States Patent [19]

Lee

[11] Patent Number: 6,052,652

[45] Date of Patent: Apr. 18, 2000

[54] METHOD FOR ANALYZING STRENGTH OF STRUCTURE AND APPARATUS USING THE SAME

[75] Inventor: Gwang Nam Lee, Anyang, Rep. of Korea

[73] Assignee: LG Industrial Systems Co., Ltd., Seoul, Rep. of Korea

[21] Appl. No.: 08/954,619

[22] Filed: Oct. 20, 1997

[30] Foreign Application Priority Data

Apr. 22, 1997 [KR] Rep. of Korea .................. 97-15128

[51] Int. Cl.[7] .................................................. G06F 19/00
[52] U.S. Cl. ............................ 702/42; 702/182; 700/97
[58] Field of Search ......................... 702/42, 182, 186; 364/468.03; 700/98, 97

[56] References Cited

U.S. PATENT DOCUMENTS

| 5,729,462 | 3/1998 | Newkink et al. ............... 364/468.03 |
| 5,920,491 | 7/1999 | Hibbitt et al. .................. 364/468.03 |

OTHER PUBLICATIONS

Key–Young Lim et al., "The Time Saving Structure Analysis of the Elevator Platform", Elevator Technology: Proceeding of ELEVCON 96, The International Ass. of Elevator Engineers; 142–147 Overhead, Nos. 1–55, Oct. 1996.

"The Time Saving Structure Analysis of the Elevator Platform," *Elevator Technology: Proceedings of ELEVCON '96*, The International Association of Elevator Engineers, by Kye–Young Lim et al., Oct. 1996. Overheads, Nos. 1–55, shown in public presentation on Oct. 23–25, 1996 in Barcelona, Spain.

*Primary Examiner*—Marc S. Hoff
*Assistant Examiner*—Bryan Bui
*Attorney, Agent, or Firm*—Oliff & Berridge, PLC

[57] ABSTRACT

A method for analyzing the strength of a structure and an apparatus using the same which are capable of more simply and accurately computing the stress of each element of the structure by selectively grouping the elements of the structure, which receive a lot stress, and analyzing the stresses of the grouped elements with respect to the entire structures. The method includes the steps of a first step for grouping a concerned element of an object structure and computing a strength of the concerned element, a second step for setting a unit load value and computing a stress of the concerned element, a third step for changing a stress value corresponding to the unit load value into a related function with respect to the entire elements, a fourth step for computing a stress based on an actual load value based on the related function and actual load value, and a fifth step for analyzing a strength of a corresponding structure based on the stress based on the actual load value.

8 Claims, 14 Drawing Sheets

| Stress [kgf/mm^2] | | |
|---|---|---|
| l1_f0 | 0.301 | 6% |
| l1_f1 | 1.279 | 26% |
| l1_f2 | -0.786 | -16% |
| l1_f3 | -0.254 | -5% |
| l1_f4 | 3.039 | 61% |
| l1_f5 | 1.539 | 31% |
| l1_f6 | -0.201 | -4% |
| l1_f7 | -0.231 | -5% |
| l1_f8 | 0.319 | 6% |
| sum(l1_fi) | 5.005 | 100% |

| Stress [kgf/mm^2] | | |
|---|---|---|
| l1_f0 | -0.087 | 10% |
| l1_f1 | -0.117 | 14% |
| l1_f2 | -0.005 | 1% |
| l1_f3 | -0.004 | 0% |
| l1_f4 | -0.009 | 1% |
| l1_f5 | -0.206 | 25% |
| l1_f6 | -0.362 | 43% |
| l1_f7 | -0.043 | 5% |
| l1_f8 | -0.003 | 0% |
| sum(l1_fi) | -0.838 | 100% |

| Stress [kgf/mm^2] | | |
|---|---|---|
| l1_f0 | 0.117 | 2% |
| l1_f1 | -0.051 | -1% |
| l1_f2 | -0.003 | 0% |
| l1_f3 | 0.233 | 5% |
| l1_f4 | 0.282 | 6% |
| l1_f5 | -0.178 | -4% |
| l1_f6 | 4.443 | 94% |
| l1_f7 | -0.108 | -2% |
| l1_f8 | -0.028 | -1% |
| sum(l1_fi) | 4.708 | 100% |

| Stress [kgf/mm^2] | | |
|---|---|---|
| l1_f0 | -0.120 | 2% |
| l1_f1 | -0.010 | 0% |
| l1_f2 | -0.013 | 0% |
| l1_f3 | 0.000 | 0% |
| l1_f4 | -5.900 | 90% |
| l1_f5 | -0.023 | 0% |
| l1_f6 | -0.004 | 0% |
| l1_f7 | -0.473 | 7% |
| l1_f8 | 0.004 | 0% |
| sum(l1_fi) | -6.539 | 100% |

| Stress [kgf/mm^2] | | |
|---|---|---|
| l1_f0 | 0.257 | 9% |
| l1_f1 | 0.873 | 32% |
| l1_f2 | -0.048 | -2% |
| l1_f3 | -0.028 | -1% |
| l1_f4 | 0.442 | 16% |
| l1_f5 | 1.393 | 51% |
| l1_f6 | -0.112 | -4% |
| l1_f7 | -0.049 | -2% |
| l1_f8 | 0.023 | 1% |
| sum(l1_fi) | 2.751 | 100% |

| Stress [kgf/mm^2] | | |
|---|---|---|
| l1_f0 | -0.247 | 6% |
| l1_f1 | -1.403 | 33% |
| l1_f2 | 0.000 | 0% |
| l1_f3 | 0.000 | 0% |
| l1_f4 | 0.000 | 0% |
| l1_f5 | -2.603 | 61% |
| l1_f6 | 0.000 | 0% |
| l1_f7 | 0.000 | 0% |
| l1_f8 | 0.000 | 0% |
| sum(l1_fi) | -4.253 | 100% |

| | | by FEM | by Hcs |
|---|---|---|---|
| P0 | CROSS HEAD | 5.000 | 5.005 |
| P1 | SLING | 2.603 | 2.595 |
| P2 | FITTING PLATE | −0.838 | −0.838 |
| P3 | FRAME | 4.710 | 4.708 |
| P4 | BASE | −5.350 | −5.351 |
| P5 | FITTING BEAM | −6.540 | −6.539 |
| P6 | TIE ROD | 2.740 | 2.751 |
| P7 | KICK PLATE | −4.250 | −4.253 |

[kgf/mm^2]

FIG. 14

METHOD FOR ANALYZING STRENGTH OF STRUCTURE AND APPARATUS USING THE SAME

BACKGROUND OF THE INVENTION

1. Field of the Invention

The present invention relates to a method for analyzing the strength of a structure and an apparatus using the same, and in particular to an improved method for analyzing the strength of a structure and an apparatus using the same which are capable of more simply and accurately computing the stress of each element of the structure by selectively grouping the elements of the structure, which are judged to receive a lot stress, and analyzing the stresses of the grouped elements with respect to the entire structures.

2. Description of the Conventional Art

Conventionally, the stress analyzing method is classified into a classical method and a numerical method. The classical method is directed to using an exact solution method and an approximate solution method. The numerical method includes a method for computing a predetermined energy, a boundary element method, a finite difference method, a finite element method (FEM), etc.

FIG. 1 illustrates a method for computing the stresses of each element of a structure using an FEM solver, and FIG. 2 illustrates a method for sequentially computing the stresses of the entire elements using the FEM solver. In both the above methods, a cage of an elevator system is used as a structure.

The conventional strength analyzing method of a structure is directed to computing the load actually applied to a structure by using one analyzing method among various stress analyzing methods. Namely, the stress of each element of a structure is computed based on the actual load, and then the strength of the structure which is required in a spec based on the thusly computed stress of each element is analyzed.

However, if the loads applied to the structure is changed, or the shape of the structure or the size (X, Y and Z dimension) of the same is changed, the above-described analyzing step should be performed from the first step thereof.

Therefore, in the conventional art, there are problems for analyzing the strength of a structure such as a cage of an elevator system, a vehicle, a ship, an aircraft, etc., and the conventional art needs much time and manpower.

Furthermore, even if the strength of the structure is properly analyzed during the designing step, when the elements of the structure should be changed by a request of a user or client, the stresses of whole elements should be re-analyzed, and the strength of the structure should be re-computed based on the thusly analyzed stresses, whereby much time and manpower are disadvantageously required therefor.

SUMMARY OF THE INVENTION

Accordingly, it is an object of the present invention to provide a method for analyzing the strength of a structure and an apparatus using the same which overcome the aforementioned problem encountered in the conventional art.

It is another object of the present invention to provide an improved method for analyzing the strength of a structure and an apparatus using the same which are capable of more simply and accurately computing the stress of each element of the structure by selectively grouping the elements of the structure, which are judged to receive a lot stress, and analyzing the stresses of the grouped elements with respect to the entire structures.

To achieve the above objects, there is provided a method for analyzing the strength of a structure, which includes the steps of a first step for grouping a concerned element of an object structure so as to compute a strength of the concerned element, a second step for setting a unit load value and computing a stress value of the concerned element, a third step for changing the stress value corresponding to the unit load value into a related function with respect to the entire elements, a fourth step for computing a stress based on an actual load value based on the related function and a actual load value, and a fifth step for analyzing a strength of a corresponding structure based on the stress based on the actual load value.

To achieve the above objects, there is provided an apparatus using a method for analyzing the strength of a structure which includes an input unit for receiving a data for analyzing a strength of a structure, a controller for grouping concerned elements among the elements of the structure and controlling a system, a stress computation unit for applying a unit load from the input unit to the grouped elements, computing a stress CSU with respect to the unit load, computing an actual stress CSA based on a related function Hcs and the actual load AL from the input unit, and outputting to the controller, an output unit for externally outputting the actual stress CSA, a related function computation unit for changing the stress CSU with respect to the unit load to a matrix form, and a memory for storing the computed related function Hcs.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 6 through 13 are views illustrating the elements of a structure (for example, an elevator system) and tables illustrating the stress values of the entire elements of the structure according to the present invention when the unit load is applied to the elements shown therein, of which:

FIG. 6 is a view when a concerned stress is at a cross head of an elevator system;

FIG. 7 is a view when a concerned stress is at a sliding of an elevator system;

FIG. 8 is a view when a concerned stress is at a fitting plate of an elevator system;

FIG. 9 is a view when a concerned stress is at a frame of an elevator system;

FIG. 10 is a view when a concerned stress is at a base of an elevator system;

FIG. 11 is a view when a concerned stress is at a fitting beam of an elevator system;

FIG. 12 is a view when a concerned stress is at a tie rod of an elevator system; and FIG. 13 is a view when a concerned stress is at a kick plate of an elevator system; and FIG. 14 is a table illustrating the stress values of each element computed based on the conventional method and the stress values of each element computed according to the present invention.

DETAILED DESCRIPTION OF THE INVENTION

Figure 1:
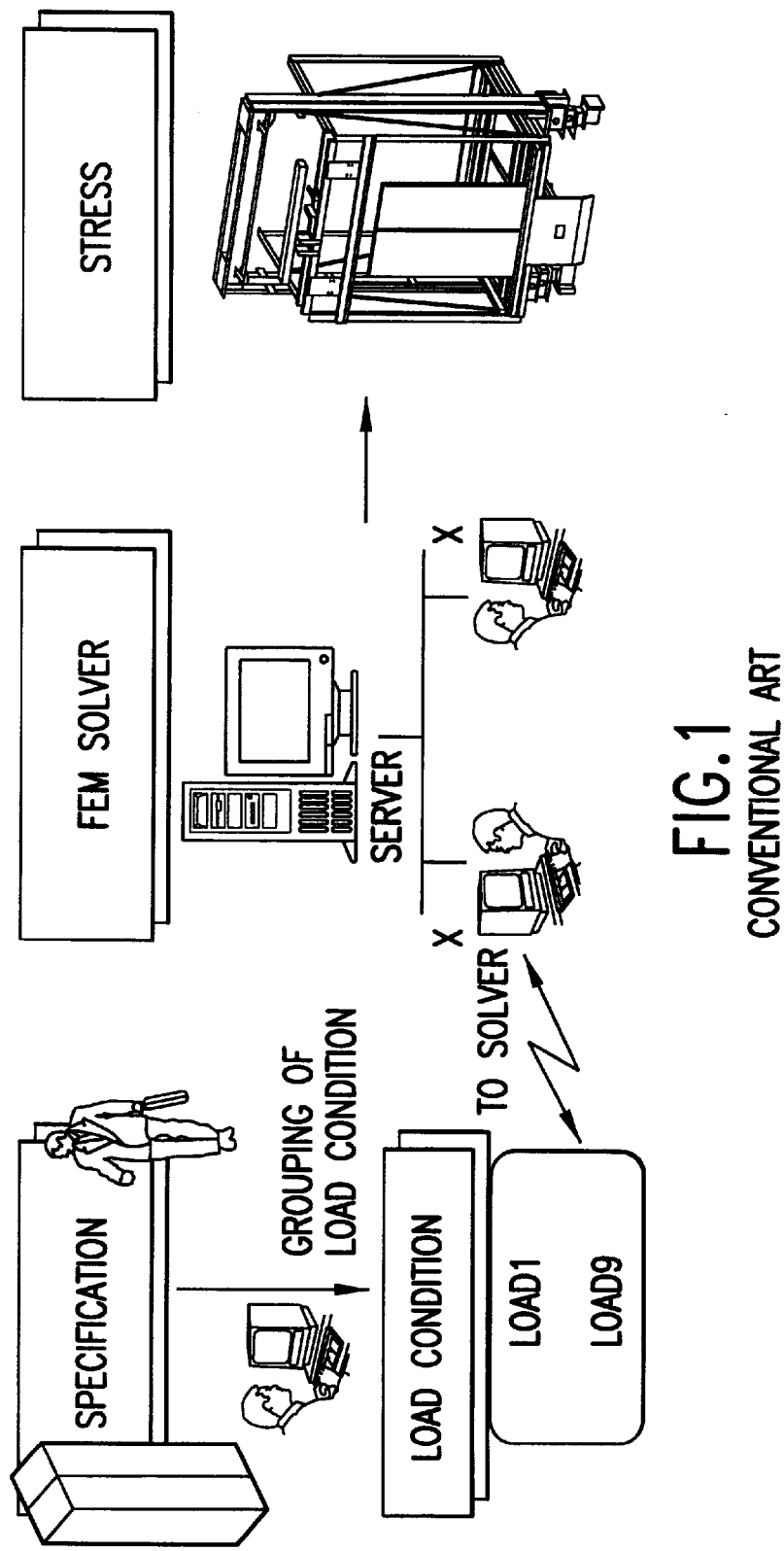
FIG. 1 is a view illustrating a method for computing the stress of an element using a conventional FEM solver.
Figure 2:
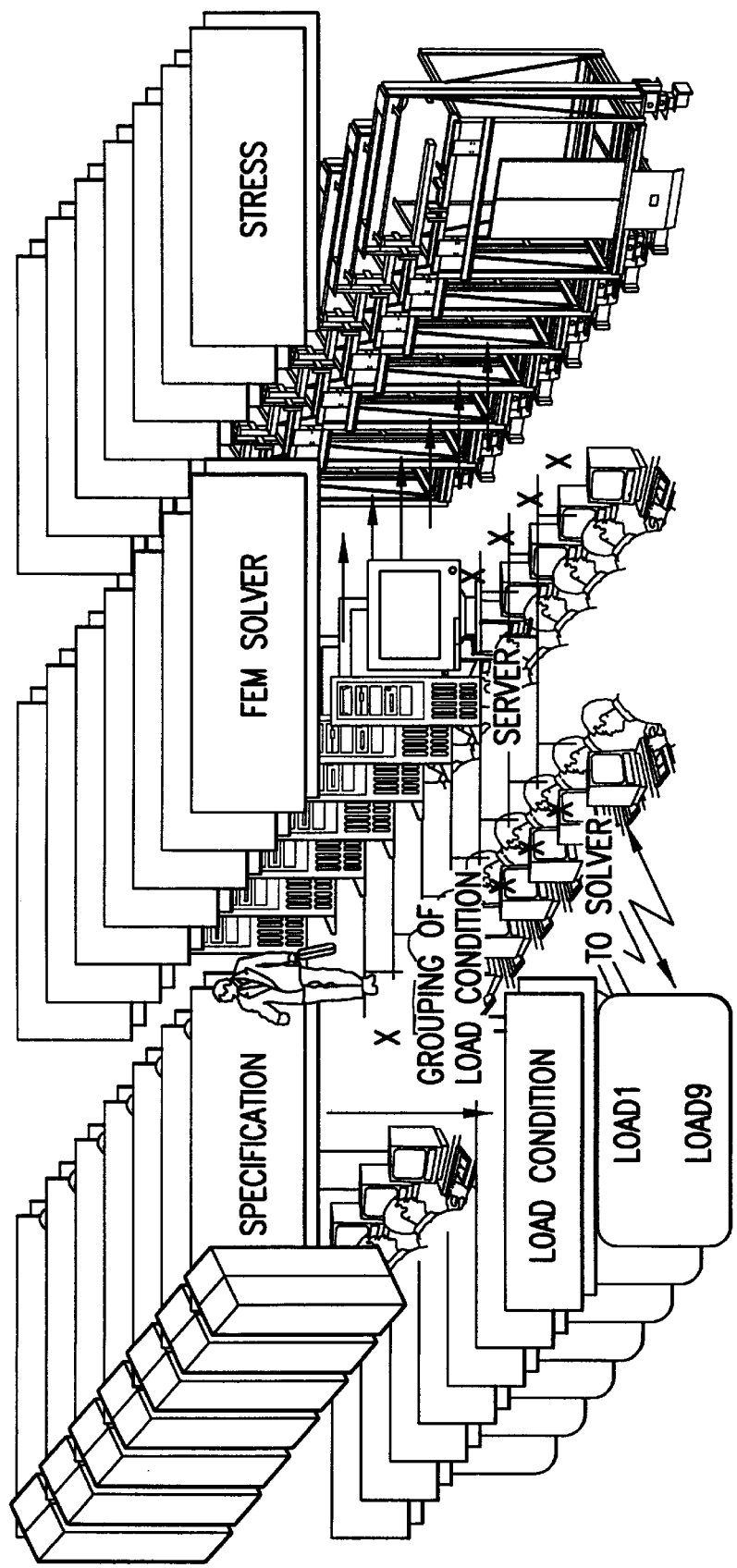
FIG. 2 is a view illustrating a method for sequentially computing the stresses of each element using a conventional FEM solver.
Figure 3:
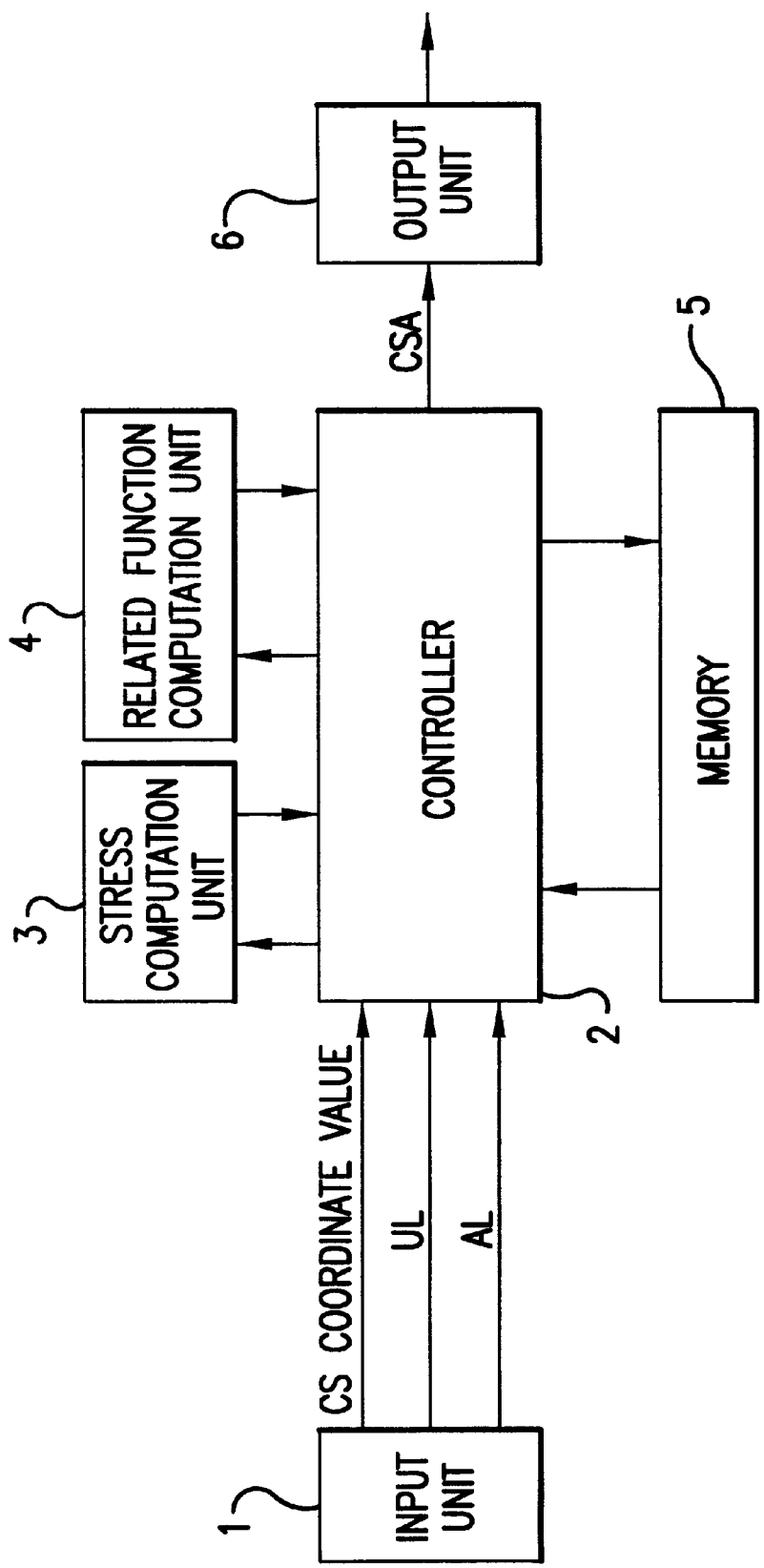
FIG. 3 is a block diagram illustrating a strength analyzing apparatus for a structure according to the present invention.

FIG. 3 illustrate a strength analyzing apparatus of a structure according to the present invention, which includes an input unit 1 for receiving a data analyzing the strength of a structure, a controller 2 for grouping the concerned elements among the elements of the structure and controlling a system, a stress computation unit 3 for applying the unit load from the input unit 1 to the grouped elements, computing a stress CSU with respect to the unit load, computing an actual stress CSA based on a related function Hcs and the actual load AL from the input unit 1, and outputting to the controller 3, an output unit 6 for externally outputting the actual stress CSA, a related function computation unit 4 for changing the stress CSU with respect to the unit load to a matrix form, and a memory 5 for storing the computed related function Hcs.

The operation of the apparatus for analyzing the strength of a structure according to the present invention will now be explained.

First, a stress which is applied to a predetermined concerned element of a structure is called as a concerned stress (CS). Here, the concerned element is selected from the elements which receive a lot stress among the entire elements of the structure and is used for determining the entire strength of the structure.

In the present invention, the concerned stresses are grouped, and the analyzing operation is performed based on the grouped concerned stresses for the reasons that if the concerned stresses of the concerned elements of a structure are fully analyzed, it is not important to analyzes the stresses of the remaining elements.

Figure 5:
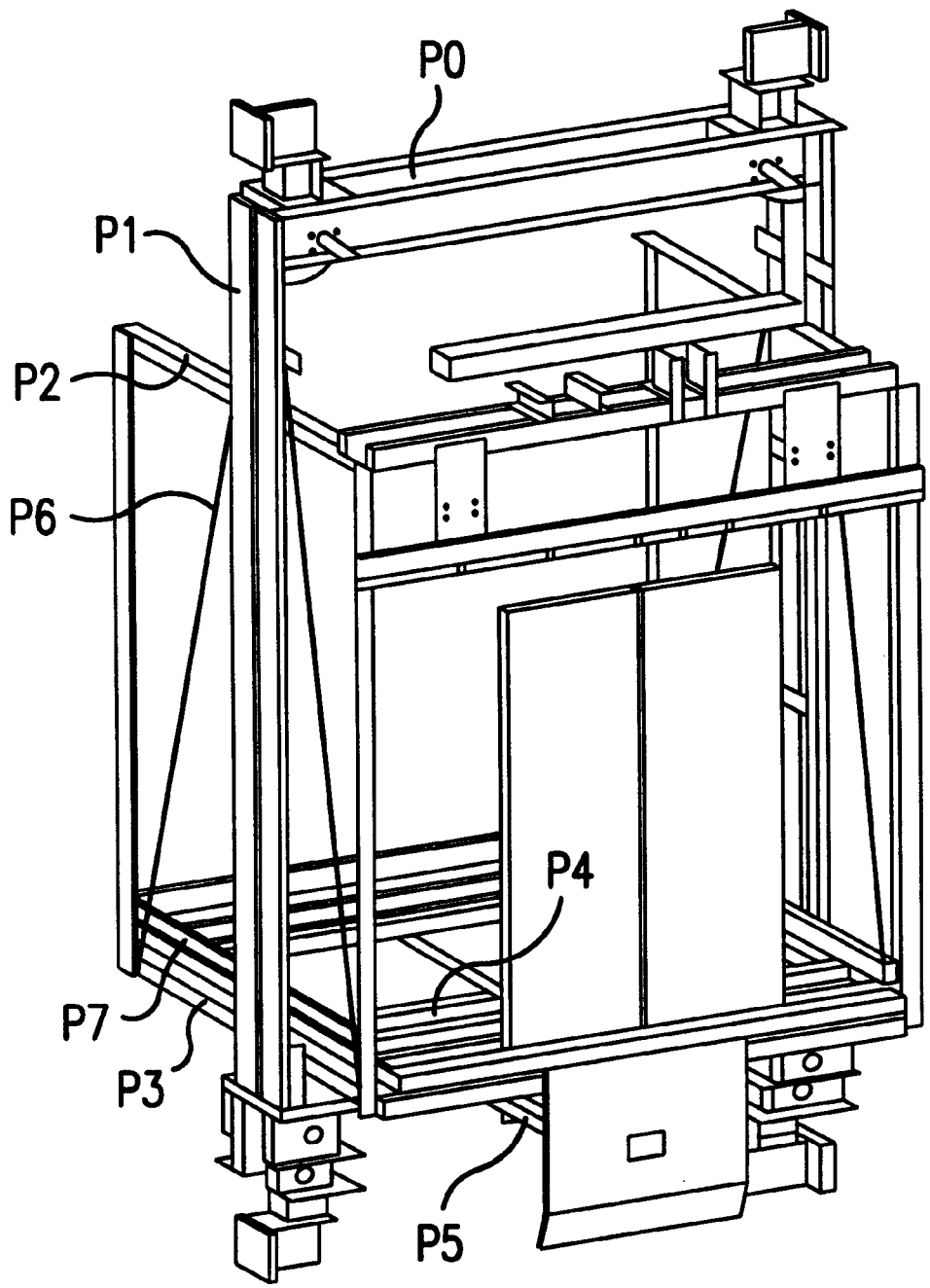
FIG. 5 is a perspective view illustrating the structure of an elevator cage according to the present invention.

In the present invention, a cage of the elevator system is used as a structure. FIG. 5 illustrates the structure of an elevator cage which is used for the present invention. In FIG. 5, reference characters P0 through P7 denote concerned elements, of which P0 denotes a cross head, P1 denotes a sling, P2 denotes a fitting plate, P3 denotes a frame, P4 denotes a base, P5 denotes a fitting beam, P6 denotes a tie rod, and P7 denotes a kick plate.

A user inputs axial-values of the concerned elements P0 through P7 using the input unit 1.

The stresses corresponding to the concerned elements P0 through P7 are expressed as CS0 through SC7, and may be expressed in the following vector form, and the concerned stresses CS0 through CS7 are grouped by the controller 2 in Step ST1 shown in FIG. 4.

$$CS = [CS_0\ CS_1\ CS_2\ CS_3\ CS_4\ CS_5\ CS_6\ CS_7]^T$$

where,

CS0 denotes an X-axial stress at the cross head P1;

CS1 denotes a Z-axial stress at the sling P2;

CS2 denotes an XY-axial stress at the fitting plate P2;

CS3 denotes an X-axial stress at the frame P3;

CS4 denotes an X-axial stress at the base P4;

CS5 denotes a Z-axial stress at the fitting beam P5;

CS6 denotes an X-axial stress at the tie rod P6; and

CS7 denotes an X-axial stress at the kick plate P7.

A user inputs nine unit loads ul0 through ul8 with respect to eight stresses CS0 through CS7 grouped by the input unit 1, and the values of the unit loads $ul_0$–$ul_8$ are set to 1 ton. In addition, the stress computation unit 3 drives the FEM solver based on the unit loads ul0 through ul8, and the stresses CSU0 through CSU7 with respect to the unit load are computed in Step ST3. The thusly computed stresses CSU0 through CSU7 are changed to the related function Hcs in Step ST4.

In more detail, in the first step, the value of the first unit load ul0 is set to 1, and the values of the remaining unit loads ul1 through ul8 are set to 0, respectively, thus forming a vector UL in Step ST2, and then the FEM solver is driven based on the vector UL in Step ST3, whereby the stresses CSU0 through CSU7 are formed as a first column of an Hcs matrix in Step ST4.

$[CSU] \rightarrow [Hcs]$ $CSU_0 \quad hcs_{00}$
$\vdots \quad \vdots$
$CSU_i \quad hcs_{i0},\ i = 0, \ldots, 7$
$\vdots \quad \vdots$
$CSU_7 \quad hcs_{70}$ The values of the elements $hcs_{00} \ldots hcs_{i0} \ldots hcs_{70}$ of the related function denotes that how much the concerned elements P0 through P7 are influenced when the load (the unit load of 1 ton) is applied to the cross head P0, and the same are stored into the memory 4 through the controller 2 in Step ST5.

Figure 4:
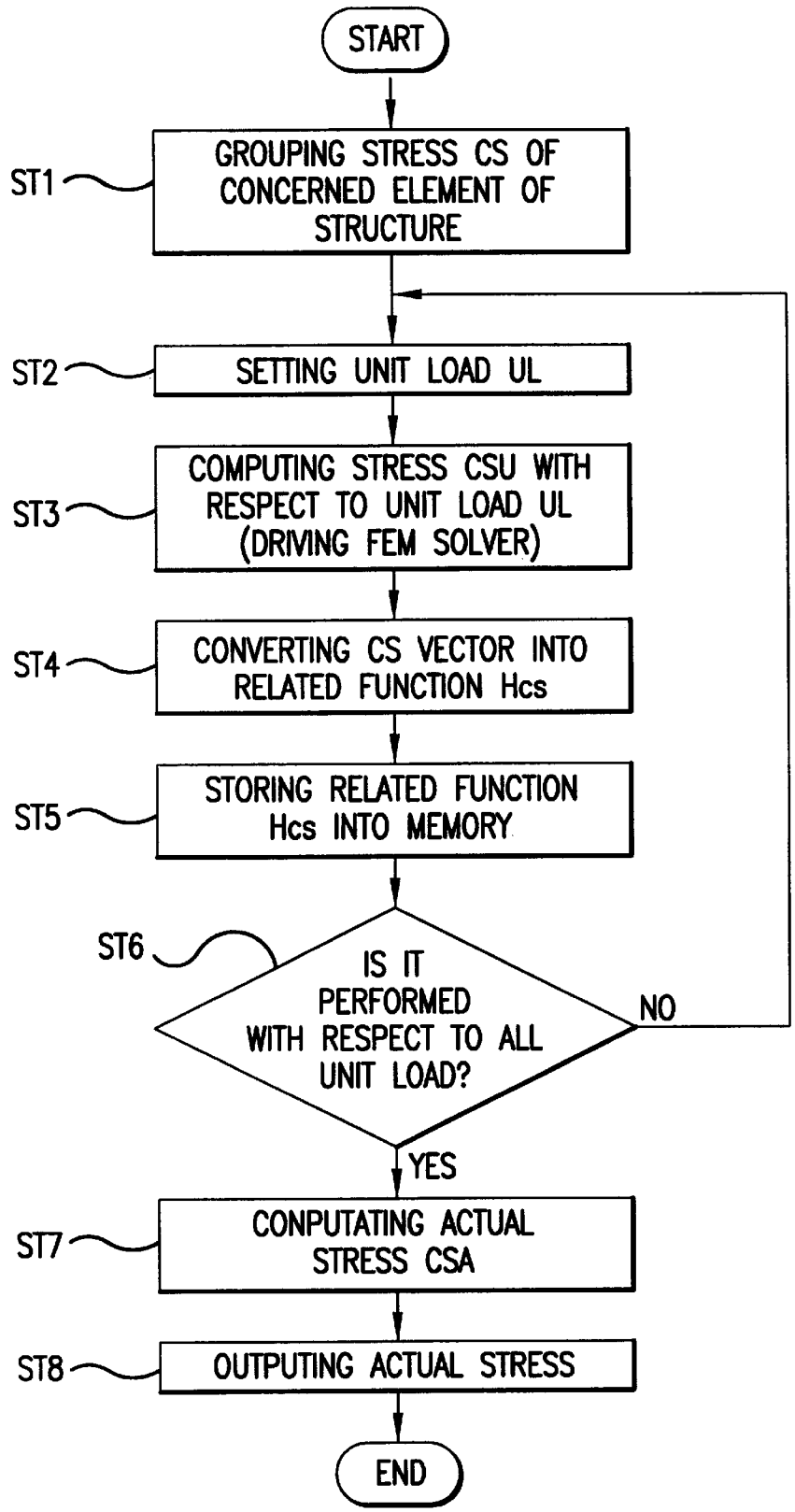
FIG. 4 is a flow chart illustrating a strength analyzing method for a structure according to the present invention.

The above-described routine is performed in Steps ST3 through ST5 shown in FIG. 4, and the above-described steps ST3 through ST5 are repeatedly performed as many times as the number of the unit rods, namely, 9 times.

In the second step, the value of the first unit load ul1 is set to 1, and the values of the remaining unit loads ul1 through ul0, ul2, ul3, . . . ul8 are all set to 0, thus forming a vector UL, and then the FEM solver is driven based on the vector UL, whereby the resultant values are formed as a second column of a related function matrix, and the elements $hcs_{01} \ldots hcs_{i1} \ldots hcs_{71}$ are stored into the memory 4.

$[CSU] \rightarrow [Hcs]$ $CSU_0 \quad hcs_{01}$
$\vdots \quad \vdots$
$CSU_1 \quad hcs_{i1}$
$\vdots \quad \vdots$
$CSU_7 \quad hcs_{71}$ In the i-th step, the value of the i-th unit load uli is set to 1, and then the FEM solver is driven, whereby the resultant values are formed as a i-th column of a related function matrix, and the elements $hcs_{0i} \ldots hcs_{ii} \ldots hcs_{7i}$ are stored into the memory 4.

$$[CSU] \rightarrow [Hcs]$$

$$\begin{array}{cc} CSU_0 & hcs_{io} \\ \vdots & \vdots \\ CSU_1 & hcs_{ii} \\ \vdots & \vdots \\ CSU_7 & hcs_{7i} \end{array}$$

The above-described steps are performed as many times as the number of the unit loads. As a result of the operation, the value of CSU0 with respect to the load ul0 is 0.304, the CSU0 with respect to the load ul1 is 1.640, CSU0 with respect to the load ul2 is −2.858, CSU0 with respect to the load ul3 is −1.268, CSU0 with respect to the load ul4 is 2.338, CSU0 with respect to the load ul5 is 0.962, CSU0 with respect to the load ul6 is −1.990, CSU0 with respect to the load ul7 is −1.111, and CSU0 with respect to the load ul8 is 0.495.

The row components of the Hcs converted from the CSU0 through CSU7 are stored in the memory 4 as follows.

$Hcs_0$=[0.304 1.640 −2.858 −1.268 2.338 0.962 −1.990 −1.111 0.495]
$Hcs_1$=[0.260, 0.646, . . . , −0.053, −0.295]
$Hcs_2$=[−0.088, −0.150, . . . , −0.208, −0.005]
$Hcs_3$=[0.118, −0.065, . . . , −0.520, −0.430]
$Hcs_4$=[−0.128, 0.005, . . . , −2.644, −0.081]
$Hcs_5$=[−0.128, 0.013, . . . , −2.274, −0.006]
$Hcs_6$=[0.260, 1.119, . . . , −0.236, −0.036]
$Hcs_7$=[−0.249, −1.799, . . . , −0.000, 0.000]

where $hcs_{ij}$ denotes that how much the j-th load affects the i-th element Pi.

In addition, the values $Hcs_0$–$Hcs_7$ stored in the memory 4 are changed to the matrix form of $Hcs_{ij}$, by the related function computation unit 3, and the controller 2 receives the thusly changed related function $Hcs_{ij}$ and outputs the same to the stress computation unit 5.

When a user inputs an actual load value AL using the input unit 1, the stress computation unit 3 computes the actual stress CSA based on the actual load AL and the changed related function $Hcs_{ij}$. In this step, the FEM solver is not used in Step ST7.

CSA=Hcs ·AL
(mx1) (mxn) (nx1) m=8, n=9

Figure 6:
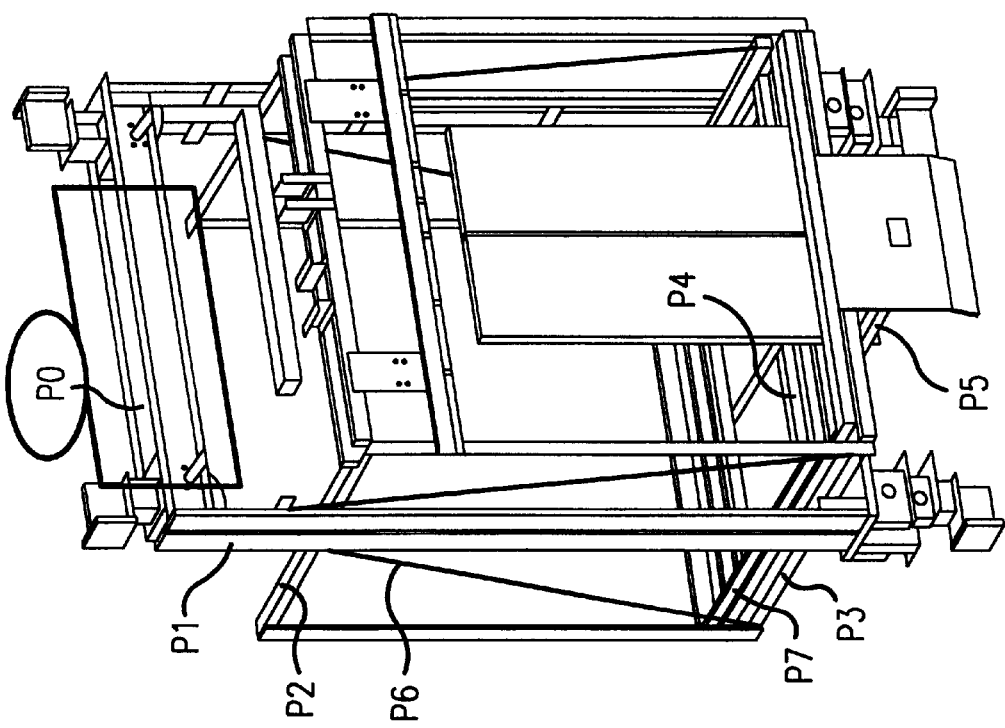
Figure 7:
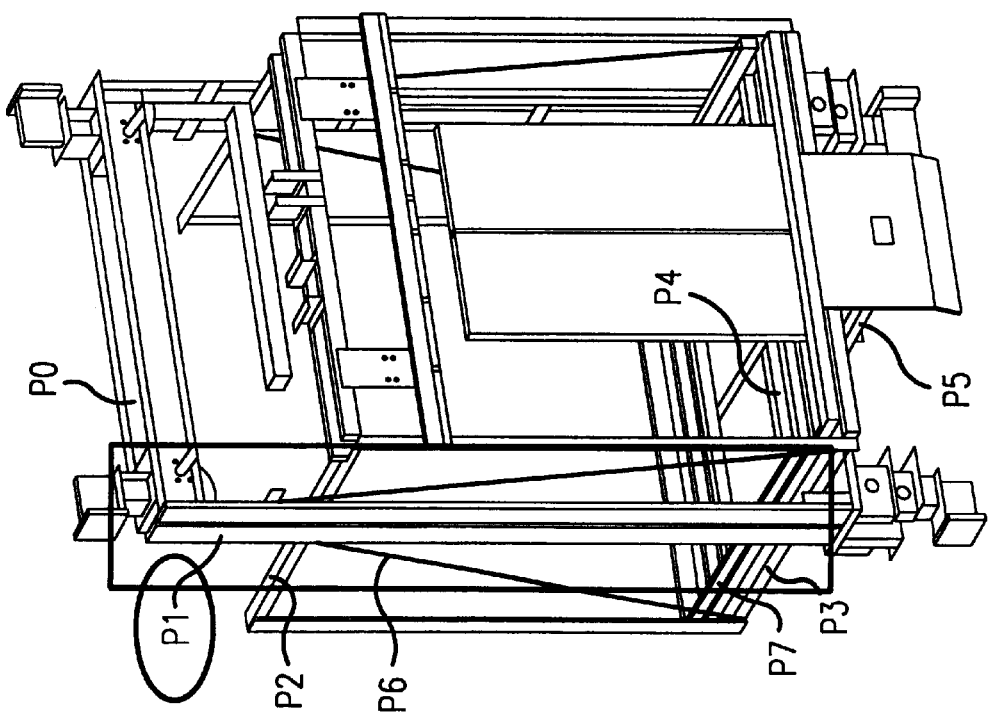
Figure 8:
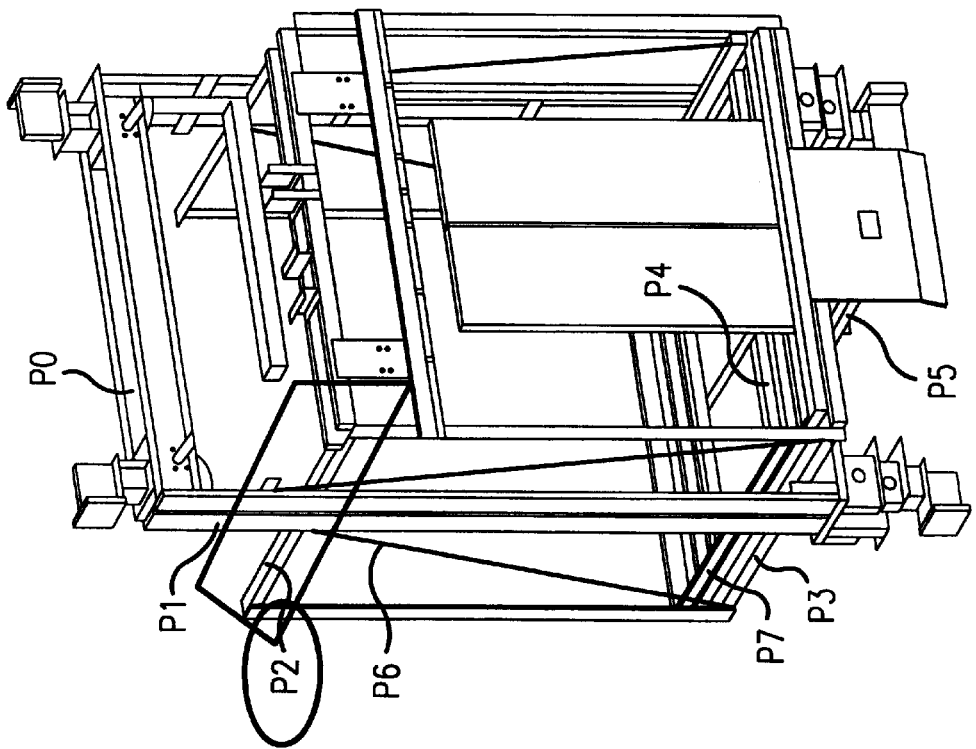
Figure 9:
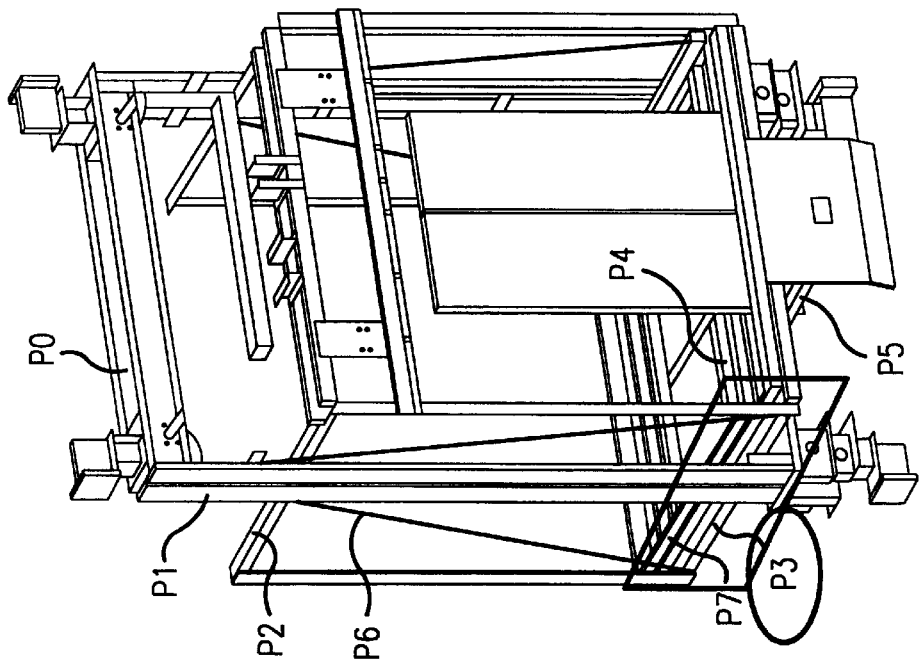
Figure 10:
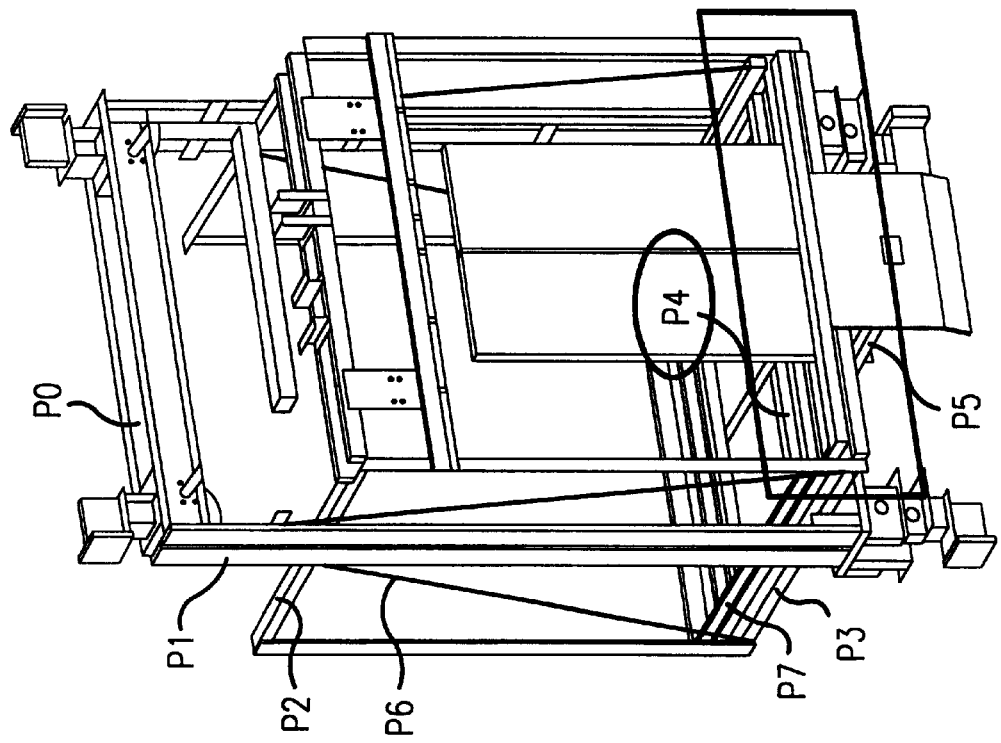
Figure 11:
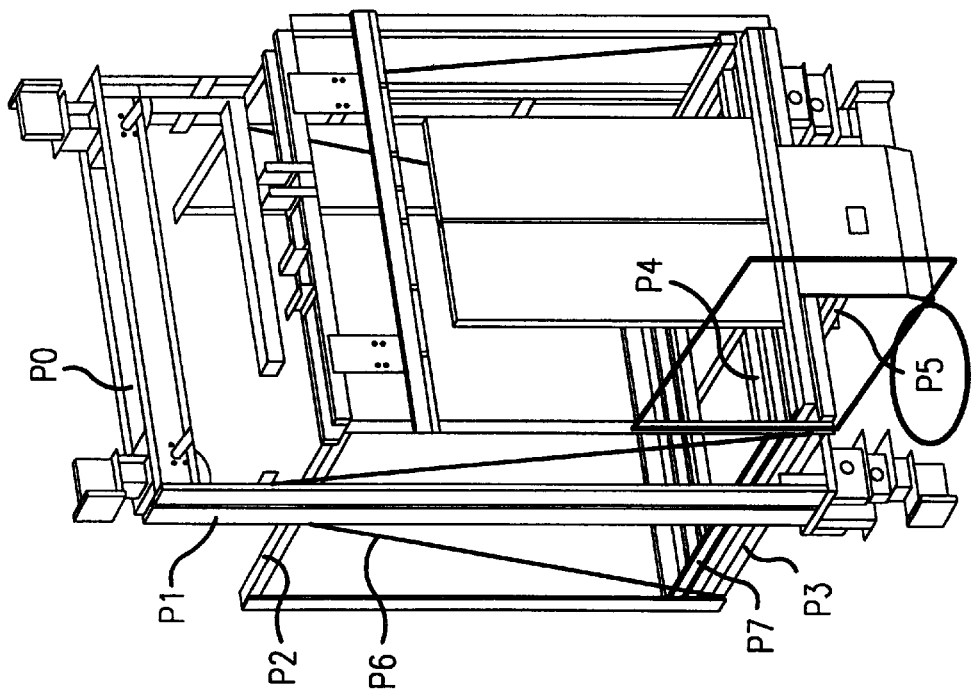
Figure 12:
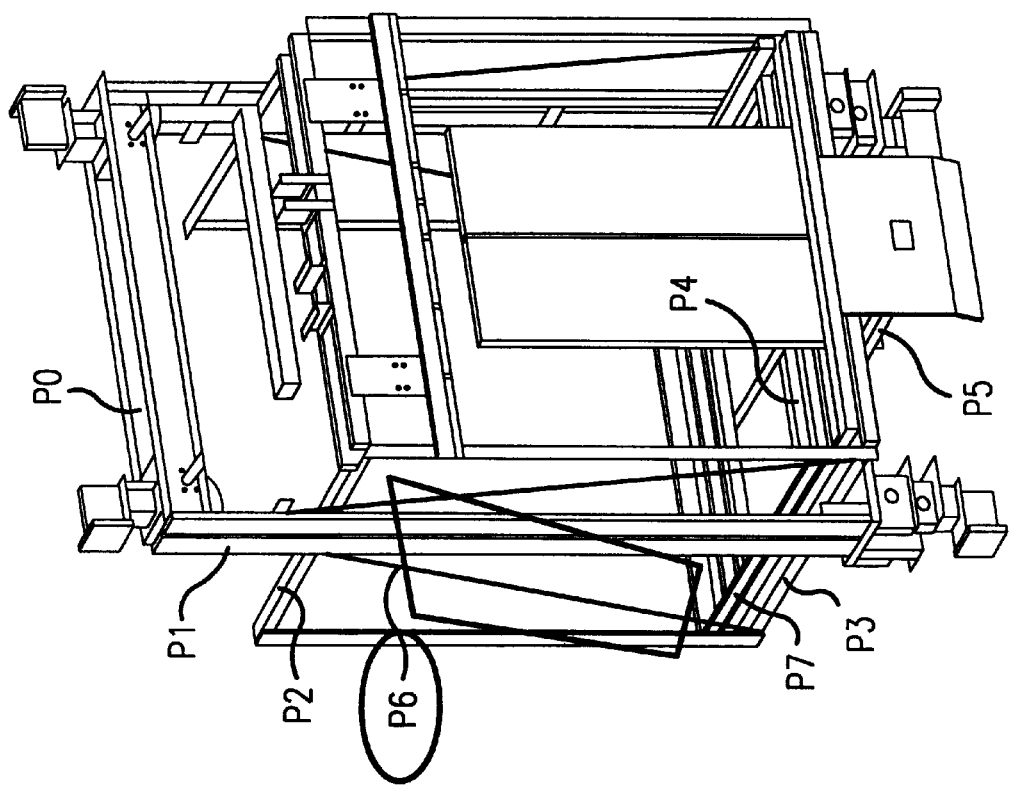
Figure 13:
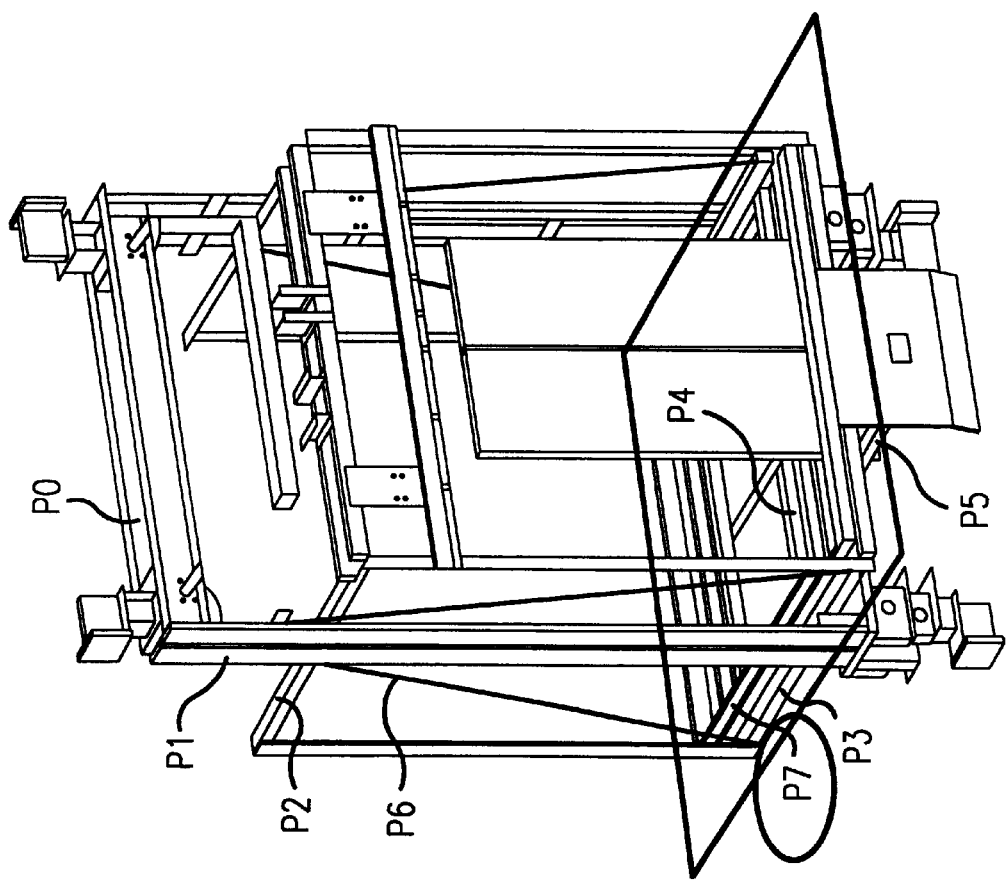

FIGS. 6 through 13 illustrate the elements of a structure (for example, an elevator system) and tables illustrating the stress values of the entire elements of the structure according to the present invention when the unit load is applied to the elements shown therein, of which, FIG. 6 is a view when a concerned stress is at a cross head of an elevator system, FIG. 7 is a view when a concerned stress is at a sliding, FIG. 8 is a view when a concerned stress is at a fitting plate, FIG. 9 is a view when a concerned stress is at a frame, FIG. 10 is a view when a concerned stress is at a base, FIG. 11 is a view when a concerned stress is at a fitting beam, FIG. 12 is a view when a concerned stress is at a tie rod, and FIG. 13 is a view when a concerned stress is at a kick plate.

In addition, FIG. 14 is a table illustrating the stress values of each element (P0 through P7) computed based on the conventional method and the stress values of each element (P0 through P7) computed according to the present invention. As shown therein, the compared values between the conventional art and the present invention are similar.

The output unit 4 analyzes the strength of each element (P0 through P7) based on the actual stress computed through the above-described steps, and the thusly computed actual stress CSA, the related function Hcs thereof, the actual load values AL and the strength data are outputted through an externally connected printer or a monitor (not shown) in Step ST8.

As described above, in the present invention, the related function of each element of a structure, namely, the stress between the elements of the structure, is computed, so that it is possible to more simply compute an actual stress CSA of entire elements based on the related function, and it is possible to analyzes the strength of the structure based on the actual stress CSA. Therefore, it is possible to significantly reduce time consumption and manpower by reducing the use of an analyzing program such as an FEM solver.

In the present invention, the method for analyzing the strength of a structure and an apparatus using the same according to the present invention is preferably used to analyze the strength of the cage of the elevator system. In addition, the above method and apparatus may be adapted to analyze the strength of another structure such as a vehicle, an aircraft, a ship, etc. Furthermore, the method and apparatus according to the present invention may be used for analyzing the strength of a predetermined mechanical structure as well as an electromagnetic force.

Although the preferred embodiment of the present invention has been disclosed for illustrative purposes, those skilled in the art will appreciate that various modifications, additions and substitutions are possible, without departing from the scope and spirit of the invention as recited in the accompanying claims.

What is claimed is:

1. A method for analyzing a strength of a structure, comprising the steps of:

a first step for grouping a concerned element of an object structure and so as to compute a strength of the concerned element;

a second step for setting a unit load value and computing a stress value of the concerned element;

a third step for changing the stress value corresponding to the unit load value into a related function with respect to the entire elements;

a fourth step for computing a stress based on an actual load value based on the related function and a actual load value; and a fifth step for analyzing a strength of a corresponding structure based on the stress based on the actual load value.

2. The method of claim 1, wherein in the second step, a stress of each element is computed using an FEM solver.

3. The method of claim 1, wherein in the second step, when allocating the unit load value with respect to a corresponding concerned element, the unit load value with respect to one concerned element is selected as a previously set value, and zero (0) is allocated with respect to the remaining concerned elements.

4. The method of claim 1, wherein in the third step, the thusly computed stress values are sequentially stored into a memory, and when the storing step is finished, the entire stress values are aligned in a matrix form.

5. The method of claim 1, wherein in the first step, said structure is a cage of an elevator system.

6. The method of claim 5, wherein said concerned element of a structure is selected from the group comprising a cross head, a sling, a fitting plate, a frame, a base, a fitting beam, a tie rod, and a kick plate of an elevator cage.

7. A strength analyzing apparatus for a structure, comprising:

an input means for receiving a data for analyzing a strength of a structure;

a controller for grouping concerned elements among the elements of the structure and controlling a system;

a stress computation unit for applying a unit load from the input unit to the grouped elements, computing a stress CSU with respect to the unit load, computing an actual stress CSA based on a related function Hcs and the actual load AL from the input unit, and outputting to the controller;

an output unit for externally outputting the actual stress CSA;

a related function computation unit for changing the stress CSU with respect to the unit load to a matrix form; and a memory for storing the computed related function Hcs.

8. The apparatus of claim 7, wherein said input means is a keyboard.

* * * * *